US011866825B2

(12) United States Patent
Hayashi et al.

(10) Patent No.: US 11,866,825 B2
(45) Date of Patent: Jan. 9, 2024

(54) GAS SUPPLY APPARATUS AND GAS SUPPLY METHOD

(71) Applicant: TOKYO ELECTRON LIMITED, Tokyo (JP)

(72) Inventors: Hiroyuki Hayashi, Nirasaki (JP); Ryosaku Ota, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 406 days.

(21) Appl. No.: 17/295,003

(22) PCT Filed: Nov. 13, 2019

(86) PCT No.: PCT/JP2019/044579
§ 371 (c)(1),
(2) Date: May 18, 2021

(87) PCT Pub. No.: WO2020/110736
PCT Pub. Date: Jun. 4, 2020

(65) Prior Publication Data
US 2022/0010430 A1 Jan. 13, 2022

(30) Foreign Application Priority Data
Nov. 27, 2018 (JP) .................. 2018-221470

(51) Int. Cl.
*H01L 21/67* (2006.01)
*C23C 16/52* (2006.01)
(Continued)

(52) U.S. Cl.
CPC ........ *C23C 16/45561* (2013.01); *C23C 16/52* (2013.01); *H01J 37/32192* (2013.01);
(Continued)

(58) Field of Classification Search
CPC ........................ C23C 16/52; H01L 21/6742; H01L 21/67253
See application file for complete search history.

(56) References Cited

U.S. PATENT DOCUMENTS 5,908,504 A * 6/1999 Hanley ............... C23C 16/4408
117/86
6,716,477 B1 * 4/2004 Komiyama ............. C23C 16/52
427/8
(Continued)

FOREIGN PATENT DOCUMENTS

JP 2007-242791 A 9/2007
JP 2011-247352 A 12/2011

OTHER PUBLICATIONS

PCT International Search Report and Written Opinion, PCT Application No. PCT/JP2019/044579, dated Jan. 28, 2020, 8 pages (with English translation of PCT International Search Report).

*Primary Examiner* — Cachet I Proctor
(74) *Attorney, Agent, or Firm* — Fenwick & West LLP

(57) ABSTRACT

An apparatus includes a venting mechanism for venting a treatment vessel, a gas supply path including an upstream flow path to which a gas is supplied from a gas source, and multiple branch paths formed by branching a downstream side of the upstream flow path into multiple paths, each branch path being connected to the treatment vessel. The apparatus further includes first valves respectively provided in the branch paths to divert the gas to the branch paths, each first valve having a variable opening degree without being closed completely, a second valve provided in the upstream flow path to supply the gas or shut off the supply of the gas to a downstream side thereof, a pressure sensor that detects a pressure in the treatment vessel, and an abnormality detector that detects an abnormality in the downstream side of the second valve based on the detected pressure.

6 Claims, 7 Drawing Sheets

(51) Int. Cl.
*C23C 16/455* (2006.01)
*H01J 37/32* (2006.01)
*H01L 21/31* (2006.01)

(52) U.S. Cl.
CPC .. *H01J 37/32357* (2013.01); *H01J 37/32449* (2013.01); *H01J 37/32834* (2013.01); *H01J 2237/3321* (2013.01); *H01L 21/31* (2013.01)

(56) References Cited

U.S. PATENT DOCUMENTS

| | | | | |
|---|---|---|---|---|
| 2004/0011468 | A1* | 1/2004 | Hirose | H01L 21/67109 156/345.52 |
| 2015/0125591 | A1* | 5/2015 | Hsieh | C23C 16/4402 118/712 |
| 2016/0379857 | A1* | 12/2016 | Ogawa | H01L 21/3065 137/587 |
| 2018/0364084 | A1* | 12/2018 | Cheng | C23C 16/4412 |
| 2018/0374726 | A1* | 12/2018 | Miyoshi | H01J 37/32449 |

\* cited by examiner

GAS SUPPLY APPARATUS AND GAS SUPPLY METHOD

TECHNICAL FIELD

The present disclosure relates to a gas supply apparatus and a gas supply method.

BACKGROUND

In a semiconductor device manufacturing process, a semiconductor wafer (hereinafter, referred to as "wafer") that is a substrate is accommodated in a processing chamber, and a gas is supplied into the processing chamber to perform processing. A piping system is configured to supply the gas into the processing chamber. The piping system may solve a gas leakage problem. Further, valves are disposed in the piping system.

Patent Document 1 discloses an apparatus including a first pipe, a processing gas flow controller, a second pipe, a first pipe joint portion for connecting the first pipe and the processing gas flow controller, a second pipe joint portion for connecting the second pipe and the processing gas flow controller, and a gas box. The gas box accommodates the first pipe joint portion, the second pipe joint portion, and the processing gas flow controller. The gas box further includes a suction port for sucking the atmosphere outside the gas box into the gas box and a venting port for venting the atmosphere inside the gas box. In addition, patent document 2 discloses a valve having a locking structure. The valve includes a body part in which a flow passage is formed, a valve element part installed to be advanced into and retreated from the flow passage, a handle part that is rotated to adjust the advanced and retreated amount of the valve element part, and a rotation prevention member for preventing the relative rotation of the body part to the handle part.

(Patent Document)
Japanese Patent Application Publication No. 2007-242791
Japanese Patent Application Publication No. 2011-247352

SUMMARY

In view of the above, the present disclosure provides a technique capable of preventing, with a simple configuration, gas leakage from a gas supply path when branching a downstream flow path of the gas supply path and supplying a gas to a treatment vessel.

In accordance with an aspect of the present disclosure, there is provided a gas supply apparatus including: a treatment vessel having a substrate therein to perform processing on the substrate; a venting mechanism configured to vent an inside of the treatment vessel to form a vacuum atmosphere; a gas supply path including an upstream flow path to which a gas is supplied from a gas source, and a plurality of branch paths formed by branching a downstream side of the upstream flow path into a plurality of paths, each of the branch paths being connected to the treatment vessel; first valves respectively provided in the branch paths in order to divert the gas supplied to the upstream flow path to the branch paths, each of the first valves having a variable opening degree without being closed completely; a second valve provided in the upstream flow path to supply the gas or shut off the supply of the gas to a downstream side thereof; a pressure sensor configured to detect a pressure in the treatment vessel; and an abnormality detector configured to detect an abnormality in the downstream side of the second valve in the gas supply path based on the detected pressure in the treatment vessel.

Effect of the Invention

In accordance with the aspect of the present disclosure, it is possible to prevent gas leakage, with a simple configuration, from a gas supply path when branching a downstream flow path of the gas supply path and supplying a gas to a treatment vessel.

DETAILED DESCRIPTION

A film forming apparatus 1 that is an embodiment of a gas supply apparatus of the present disclosure will be described with reference to a longitudinal side view of FIG. 1. The film forming apparatus 1 includes a circular treatment vessel 11 having a wafer W therein, and a gas is supplied from multiple locations in the treatment vessel 11. The film forming apparatus 1 is configured such that the gas is turned into plasma by microwaves and a boron-containing silicon nitride film (SiBN film) is formed on the wafer W by chemical vapor deposition (CVD). In order to perform highly uniform processing on the wafer W, the gas and the microwaves are supplied to each of the multiple locations in the treatment vessel 11. As will be described in detail later, the film forming apparatus 1 is configured to prevent, when there is a risk of gas leakage from a piping system configured to supply a gas to the multiple locations in the treatment vessel 11, the gas leakage by detecting a cause of the gas leakage.

Figure 2:
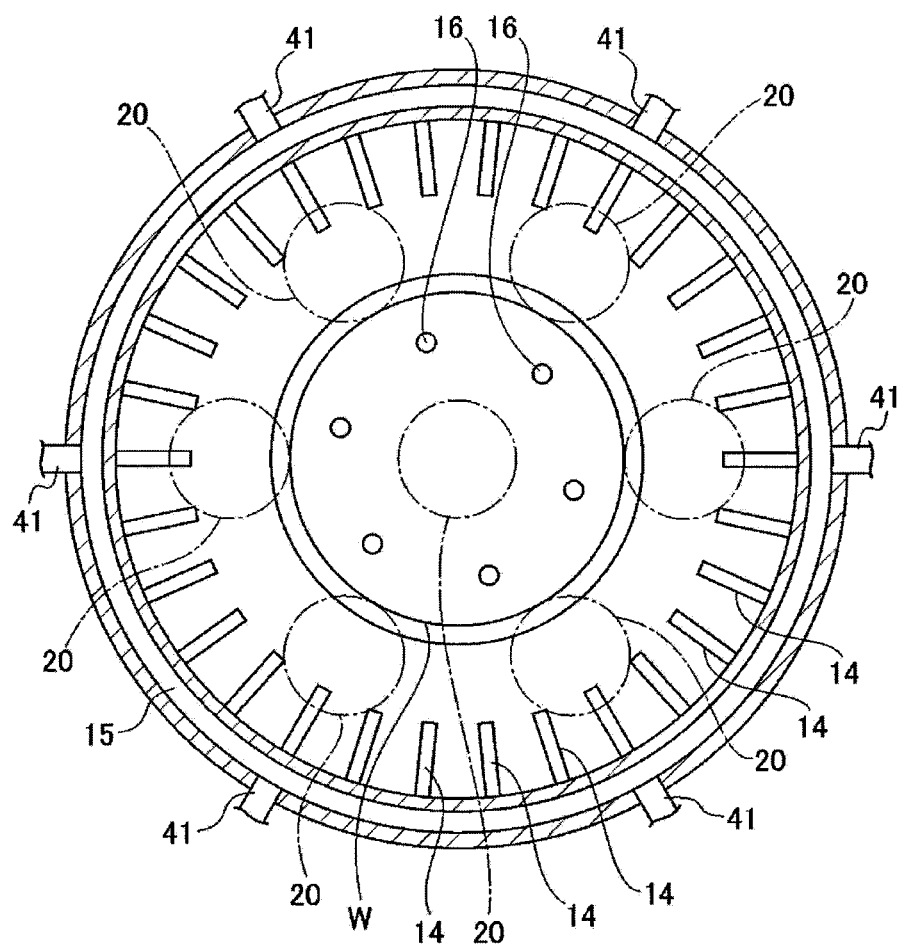
FIG. 2 is a horizontal plan view of a treatment vessel of the film forming apparatus.

The treatment vessel 11 is provided in an atmospheric atmosphere and a circular stage 12 on which the wafer W is placed is disposed in the treatment vessel 11. The stage 12 is configured to heat the wafer W to a predetermined temperature in order to perform the CVD. Further, the treatment vessel 11 is constantly vented (exhausted) by a venting mechanism (VM) 13, for example, to form a vacuum atmosphere having a desired pressure. FIG. 2 shows a horizontal plan view of the treatment vessel 11. On a sidewall of the treatment vessel 11, thirty straight tubular-shaped sidewall nozzles 14 for supplying a gas(s) are disposed above the stage 12 while being spaced apart from each other at equal intervals in a circumferential direction of the treatment vessel 11.

The sidewall nozzles 14 inject a gas(s) in a horizontal direction toward the center of the stage 12 in plan view. In the sidewall of the treatment vessel 11, a buffer space 15 having an annular shape in plan view is formed along the circumference of the sidewall to supply the gas to the sidewall nozzles 14. Further, the downstream ends of six pipes 41 that are gas supply pipes are connected from the outside of the treatment vessel 11 to the buffer space 15 at equal intervals along the circumference of the treatment vessel 11. In other words, the gas supplied from each of the pipes 41 is injected from the corresponding sidewall nozzle 14 through the buffer space 15.

Further, six straight tubular-shaped ceiling nozzles 16, for example, are disposed at a ceiling portion of the treatment vessel 11 at equal intervals along the circumference of the treatment vessel 11. A gas is vertically supplied downward from each of the ceiling nozzles 16. The downstream ends of three pipes 42 are connected to the ceiling portion of the treatment vessel 11 from the outside of the treatment vessel 11. A buffer space (not shown) is formed in a ceiling wall of the treatment vessel 11, and the gas supplied from each of the pipes 42 is injected from the corresponding ceiling nozzle 16 through the buffer space.

Seven antenna modules 2 for introducing microwaves into the treatment vessel 11 are disposed at the ceiling portion of the treatment vessel 11. Areas positioned vertically below areas where the antenna modules 2 are disposed in the treatment vessel 11 serve as microwave irradiation areas 20. One of the irradiation areas 20 is located at the center of the stage 12, and the other six are distant from the center of the stage 12 while being spaced apart from each other at equal intervals along the circumference of the treatment vessel 11 in plan view. Since the irradiation areas 20 are arranged at different positions in the circumferential direction in the treatment vessel 11 in plan view, the pipes 41 are connected to different locations in the circumferential direction of the sidewall of the treatment vessel 11 in plan view and are configured to introduce the gases.

The film forming apparatus 1 includes a microwave output unit 21 (see FIG. 1), and the microwave output unit 21 distributes and supplies microwaves to the antenna modules 2. Each of the antenna modules 2 constituting the microwave irradiation unit includes an amplifier unit (AMP) 22 and a microwave introducing mechanism 23. The amplifier unit 22 includes, in addition to an amplifier, a phasor for adjusting distribution of plasma by changing a phase of a microwave, an isolator for separating a reflected microwave reflected by an antenna unit of the microwave introducing mechanism 23 and directed toward the amplifier, and the like.

Figure 3:
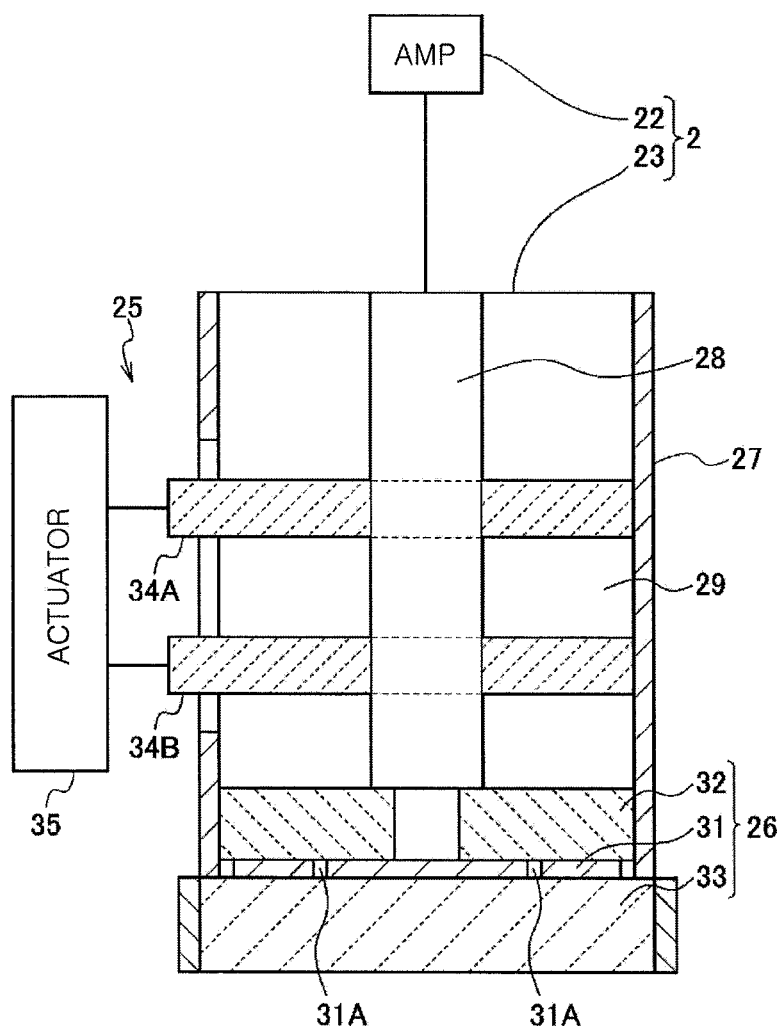
FIG. 3 is a longitudinal side view of an antenna module of the film forming apparatus.

The microwave introducing mechanism 23 will be briefly described with reference to FIG. 3. The microwave introducing mechanism 23 includes a tuner 25 and the antenna unit 26 for radiating microwaves amplified by the amplifier unit 22 into the treatment vessel 11. The microwave introducing mechanism 23 further includes a main body container 27 forming a vertically extending cylindrical outer conductor, and an inner conductor 28 extending along a central axis of the main body container 27. The main body container 27 and the inner conductor 28 form coaxial tubes and the space between an inner peripheral surface of the main body container 27 and an outer peripheral surface of the inner conductor 28 form a microwave transmission path 29.

The antenna unit 26 includes a planar antenna 31 connected to a lower end of the inner conductor 28, a microwave retarder 32 disposed on an upper surface side of the planar antenna 31, and a microwave transmission window 33 disposed on a bottom surface side of the planar antenna 31. The planar antenna 31 includes a plurality of slots (openings) 31A. The microwave retarder 32 is made of, e.g., quartz and adjusts plasma by shortening wavelengths of microwaves. The microwave transmission window 33 is made of a dielectric material such as quartz, ceramic, or the like and blocks an opening formed at the ceiling portion of the treatment vessel 11. The microwaves that have reached the planar antenna 31 through the microwave transmission path 29 pass through the microwave transmission window 33 from the slots 31A of the planar antenna 31 and are radiated into the treatment vessel 11 in a transverse electric (TE) mode.

Further, the tuner 25 includes annular slugs 34A and 34B made of dielectrics and separated from each other in a vertical direction, an actuator 35, and a tuner controller (not shown) for controlling the actuator 35. The actuator 35 adjusts vertical positions of the slugs 34A and 34B so that an impedance when viewing the microwave introducing mechanism 23 from the amplifier unit 22 becomes a predetermined value. Accordingly, impedance mismatching up to the planar antenna 31 is tuned with high precision.

Referring back to FIG. 1, the treatment vessel 11 is provided with a pressure switch (PS) 19 serving as a pressure sensor. The pressure switch 19 is switched from OFF to ON when a pressure in the treatment vessel 11 exceeds a predetermined threshold, and a detection signal indicating that the pressure exceeds the threshold is outputted to a controller 10 to be described later. The pressure switch 19 has a function of monitoring an abnormality in the piping system including the pipes 41 and 42 to be described in detail later in addition to the function of monitoring an abnormality in the treatment vessel 11.

The upstream sides of the pipes 41 connected to the sidewall of the treatment vessel 11 are joined after respectively passing through valves 5 and mass flow meters (MFM) 40, in that order, to form a merging pipe 43. The upstream side of the merging pipe 43 is connected to a gas source 45 through a valve V1, a mass flow controller (MFC) 44, and a valve V2 in that order. Further, the upstream sides of the pipes 42 connected to the ceiling portion of the treatment vessel 11 are joined after respectively passing through the valves 5 and the mass flow meters (MFM) 40, in that order, to form a merging pipe 46. The upstream side of the merging pipe 46 is connected to the gas source 45 through a valve V3, a mass flow controller (MFC) 47, and a valve V4, in that order.

The valves V1 to V4 are opened and closed based on a control signal outputted from the controller 10. Further, the valves V1 to V4 can switch a supply and a shut-off of the supply of gas to the treatment vessel 11. Further, the valves V1 to V4 are configured to be completely closed, unlike the valve 5 that is a first valve to be described in detail later, in order to shut off the supply of the gas to the treatment vessel 11. The valves V1 and V3 are examples of a second valve. Further, gas flow paths respectively formed by the merging pipes 43 and 46 are upstream flow paths, and gas flow paths respectively formed by the pipes 41 and 42 are branch paths. The upstream flow paths and the branch paths form a gas supply path.

The gas source 45 is configured to supply and shut off the supply of $SiH_4$ (monosilane) gas, $NH_3$ (ammonia) gas, $H_2$ (hydrogen) gas containing $B_2H_6$ (diboran) gas, He (helium) gas, and $N_2$ (nitrogen) gas to the merging pipes 43 and 46. $SiH_4$ gas, $NH_3$ gas, and $B_2H_6$ gas are film forming gases for forming a SiBN film; He gas is a gas for plasma generation; and $N_2$ gas is a carrier gas. $SiH_4$ gas is a flammable gas, and $B_2H_6$ gas is a toxic gas.

A housing 48 is provided to surround the valves V1 to V4 and the MFCs 44 and 47, and the merging pipes 43 and 46 extend inside the housing 48 forming an airtight space. A venting passage 49 is connected to the housing 48 and the housing 48 is vented through the venting passage 49. Further, although not shown, the housing 48 is provided with an air supply port for allowing the atmosphere outside the housing 48 to enter the housing 48. The housing 48 is configured as a so-called gas box that prevents diffusion of leakage of gases including the flammable gas and the toxic gas from joint portions (not shown) for connecting the valves V1 to V4 and the MFCs 44 and 47 to the merging pipes 43 and 46. In the housing 48, a pipe, which is provided with an MFC, a valve on the upstream side of the MFC, and a valve on the downstream side of the MFC, is provided for each gas type, and a piping system is provided to individually control flow rates and the supply/shut off of the supply of gases to the downstream sides of the merging pipes 43 and 46. Here, the piping system is illustrated in a simplified manner for the sake of convenience of description.

The valves 5 disposed in the six pipes 41 are provided to divert a gas from the merging pipe 43 to the pipes 41. The valves 5 disposed in the three pipes 42 are provided to divert a gas from the merging pipe 46 to the pipes 42. In other words, the valves 5 are not used for the switching between the supply of gas and the shut-off of the supply of the gas to the treatment vessel 11. Instead, the valves 5 constitute a splitter together with the MFMs 40 disposed on the upstream sides thereof. Opening degrees of the valves 5 can be manually changed by an operator. The valves 5 are configured such that they are not completely closed when the opening degrees thereof are changed.

Figure 4:
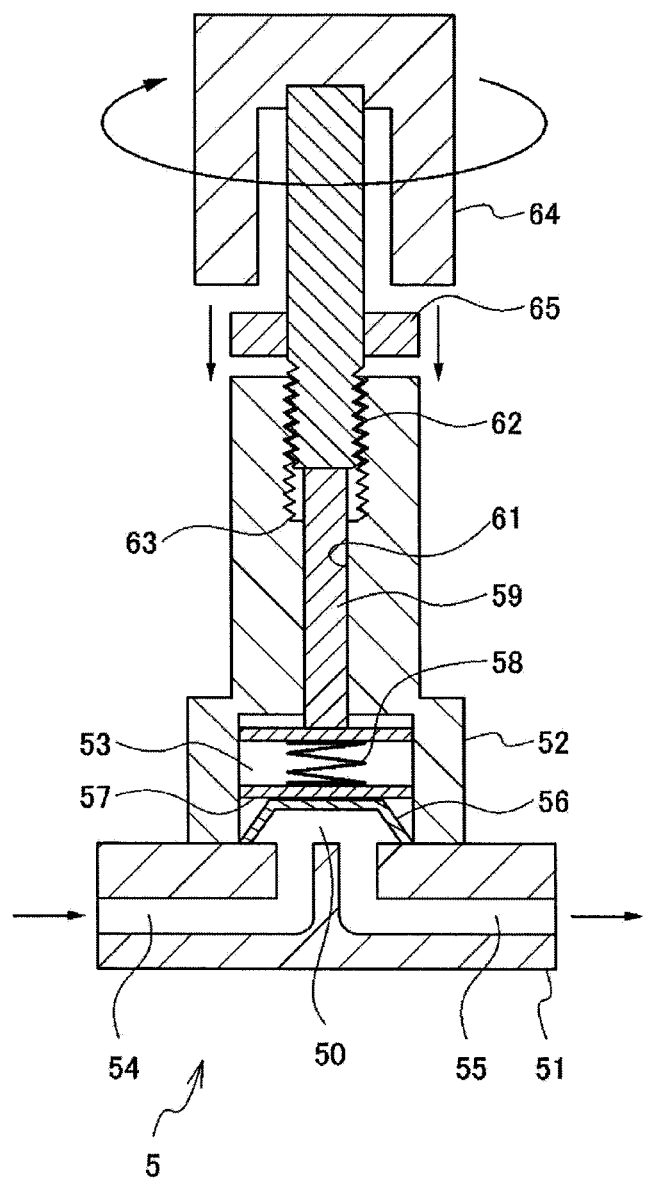
FIGS. 4 and 5 are longitudinal side views schematically showing a valve disposed in a pipe of the film forming apparatus.

Each valve 5 will be described with reference to FIG. 4 showing a schematic longitudinal side view. In this example, the valve 5 is configured as a so-called diaphragm valve that includes a horizontally elongated body 51 and a bonnet 52 fixed to the body 51 and extending upward from a longitudinal center of the body 51. The body 51 and the bonnet 52 form a main body.

A primary flow path 54 and a secondary flow path 55 disposed in the body 51 are opened at a bottom portion of a space 53 in the bonnet 52. A diaphragm 56 serving as a valve body portion that blocks an opening of the primary flow path 54 and an opening of the secondary flow path 55 is disposed in the space 53. An area below the diaphragm 56 in the space 53 serves as a flow path 50 that connects the primary flow path 54 and the secondary flow path 55. A disc facing the primary flow path 54 and the secondary flow path 55 is disposed above the diaphragm 56. A surface of the disc 57 is connected to a stem 59 disposed above the disc 57 through a spring 58.

An upper portion of the stem 59 extends upward from the bonnet 52 through a hole 61 formed through the bonnet 52 in a vertical direction, and a screw 62 formed on an outer peripheral surface of the stem 59 and a screw 63 formed on an inner peripheral surface of the hole 61 are coupled to each other. A handle 64 is provided at an upper end of the stem 59. Further, in the stem 59, a rotation stopper 65 that is a flange is provided above the bonnet 52 and below the handle 64. In the above description of the valve 5, the side on which the handle 64 shown in FIG. 4 is located is described as an upper side, but the handle 64 is not necessarily disposed in the same direction as that shown in FIG. 4. For example, the handle 64 may be disposed in a horizontal direction with respect to the body 51.

When the operator rotates the handle 64, the stem 59 serving as a rotation axis axially rotates. Due to the screw coupling between the screws 62 and 63, the handle 64 moves back and forth with respect to the bonnet 52 and the body 51 depending on a rotation amount of the handle 64, and the disc 57 connected to the handle 64 through the stem 59 moves back and forth with respect to the flow path 50. During this movement, the relative positions between the handle 64, the stem 59, the rotation stopper 65, the spring 58, and the disc 57 are not changed such that the distance between the disc 57 and the handle 64 is constant. Further, the diaphragm 56 is pressed against the disc 57 by a pressure of a gas flowing from the primary flow path 54 into the body 51 when the valve 5 is used. Therefore, a width (height) of the flow path 50 below the diaphragm 56, i.e., an opening degree of the valve 5, is determined by a height position of the disc 57 in the space 53. In other words, the width (height) of the flow path 50 below the diaphragm (the opening degree of the valve 5) is determined by a position of the handle 64 with respect to the body 51.

Figure 5:
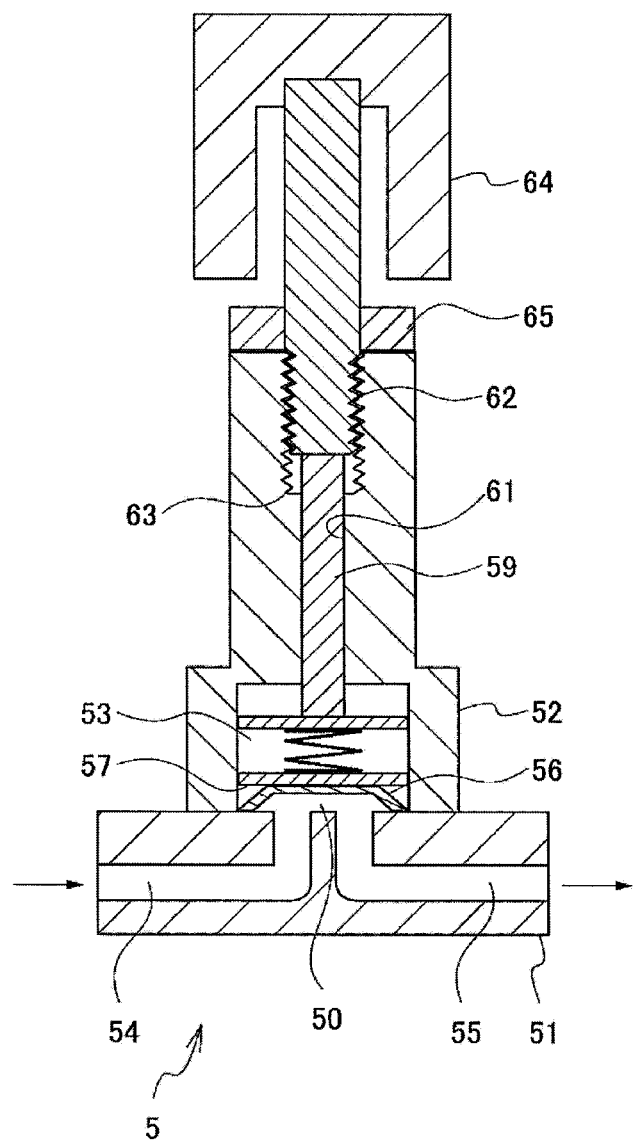

FIG. 4 shows a state in which the valve 5 has a relatively large opening degree. When the handle 64 is rotated from the state shown in FIG. 4 to reduce the opening degree of the valve 5, if the rotation amount of the handle 64 is large, the rotation stopper 65 comes into contact with the bonnet 52 as shown in FIG. 5, thereby preventing further rotation of the handle 64. In other words, FIG. 5 shows a state in which the opening degree of the valve 5 is minimized. In this state, the flow path 50 is not blocked, so that the valve 5 is not completely closed. In other words, the rotation stopper 65 serves as a contact member that limits the rotation amount of the handle 64 to prevent the disc 57 from moving to a position below a certain position in the space 53 of the bonnet 52 such that the valve 5 is not completely closed.

Instead of an orifice whose opening degree cannot be changed, the valve 5 whose opening degree can be changed is disposed in each of the pipes 41 and 42. Thus, it is easy to re-adjust a flow rate of a gas to be diverted to the pipes 41 and 42 at the time of maintenance of the film forming apparatus 1 or the like. Although the valve 5 is a diaphragm valve in the above example, the valve 5 may be any valve that has a variable opening degree and is not completely closed. Therefore, the valve 5 may be, e.g., a needle valve that adjusts an opening degree of a flow path using a needle.

Here, in order to explain the reason of using the valve 5 that is not completely closed, the case of using the valve 5 that can be completely closed will be described. In other words, it is assumed that the valve 5 is switched between a state in which the valve 5 is completely closed and a state in which the valve 5 is opened at a predetermined opening degree during the operation of the film forming apparatus 1. The outside of the treatment vessel 11 is set to an atmospheric atmosphere (atmospheric pressure) as described above. A secondary pressure of the valve 5 becomes a negative pressure lower than the atmospheric pressure due to the venting of the treatment vessel 11. Thus, a risk of gas leakage from the secondary of the valve 5 is low. However, since the valve 5 is completely closed, a primary pressure of the valve 5 may become higher than the atmospheric pressure by the gas supplied to the primary side of the valve 5. Accordingly, the gas may leak from the joint portion on the primary side of the valve 5. Specifically, the joint portion on the primary side of the valve 5 in this specification indicates, e.g., a joint portion for connecting the valve 5 and the MFM 40 to the pipe 41 or the pipe 42.

Therefore, it is considered to employ an apparatus configured to have a gas box that surrounds the MFM 40 and the valve 5 to accommodate joint portions on the primary side of the valve 5. The apparatus having the gas box prevents diffusion of gas leakage from the joint portions on the primary side of the valve 5 by performing the venting of the gas box. That is, it may be necessary to provide such a gas box different from the gas box formed by the housing 48. In addition, it may be necessary to provide a pressure switch in the merging pipes 43 and 46 to monitor whether or not the pressures in the merging pipes 43 and 46 are maintained at a negative pressure with respect to the atmospheric pressure. In other words, it may be necessary to provide such a pressure switch different from the pressure switch 19. However, an increase in the number of gas boxes or an increase in the number of pressure switches increases restriction on a layout of the devices constituting the film forming apparatus 1, and the system of the film forming apparatus 1 is scaled up in size. Thus, a manufacturing cost increases.

However, in the film forming apparatus 1, the valves 5 are configured not to be completely closed and the completely closed valves that are positioned close to the treatment vessel 11 when viewed from the treatment vessel 11 are the valves V1 and V3. Therefore, in the gas flow paths formed by the merging pipes 43 and 46 and the pipes 41 and 42, each of the downstream side of the valve V1 and the downstream side of the valve V3 is maintained at a negative pressure with respect to the atmospheric pressure due to the venting of the treatment vessel 11. On the assumption that the gas flow paths on the downstream side of the valve V1 and the downstream side of the valve V3 are incompletely sealed with respect to the atmosphere outside the pipes, i.e., the gas may leak from each of the gas flow paths to the outside of the pipes, the atmosphere outside the pipes flows into each of the gas flow paths and the pressure in the corresponding gas flow path increases. Accordingly, the pressure in the treatment vessel 11 increases, and the pressure switch 19 is switched from OFF to ON. In other words, it is possible to detect the occurrence of the gas leakage by the pressure switch 19. Therefore, it is not necessary to provide the gas box surrounding the valve 5 and the MFM 40 and the pressure switch in the merging pipes 43 and 46. Although the completely closed valves that are close to the treatment vessel 11 when viewed from the treatment vessel 11 are the valves V1 and V3, the valves V1 and V3 are surrounded by the housing 48 as described above. In other words, even if the pressure on the primary side of each of the valves V1 and V3 becomes high and the gas leakage occurs from the primary side, the gas diffusion to the outside can be prevented.

Further, in the case where the valve 5 is configured to be completely closed, the pressure in the treatment vessel 11 is not increased even if the gas leakage may occur in the gas flow path on the upstream side of the valve 5 due to incomplete sealing between the pipe and the outside. In other words, the pressure switch 19 cannot monitor the abnormality of the gas flow path on the upstream side of the valve 5. Therefore, by using the valve 5 that is configured not to be completely closed, the monitoring range where the abnormality of the gas flow path can be monitored by the pressure switch 19 is increased from the downstream sides of the valves V1 and V3 to the treatment vessel 11.

Figure 1:
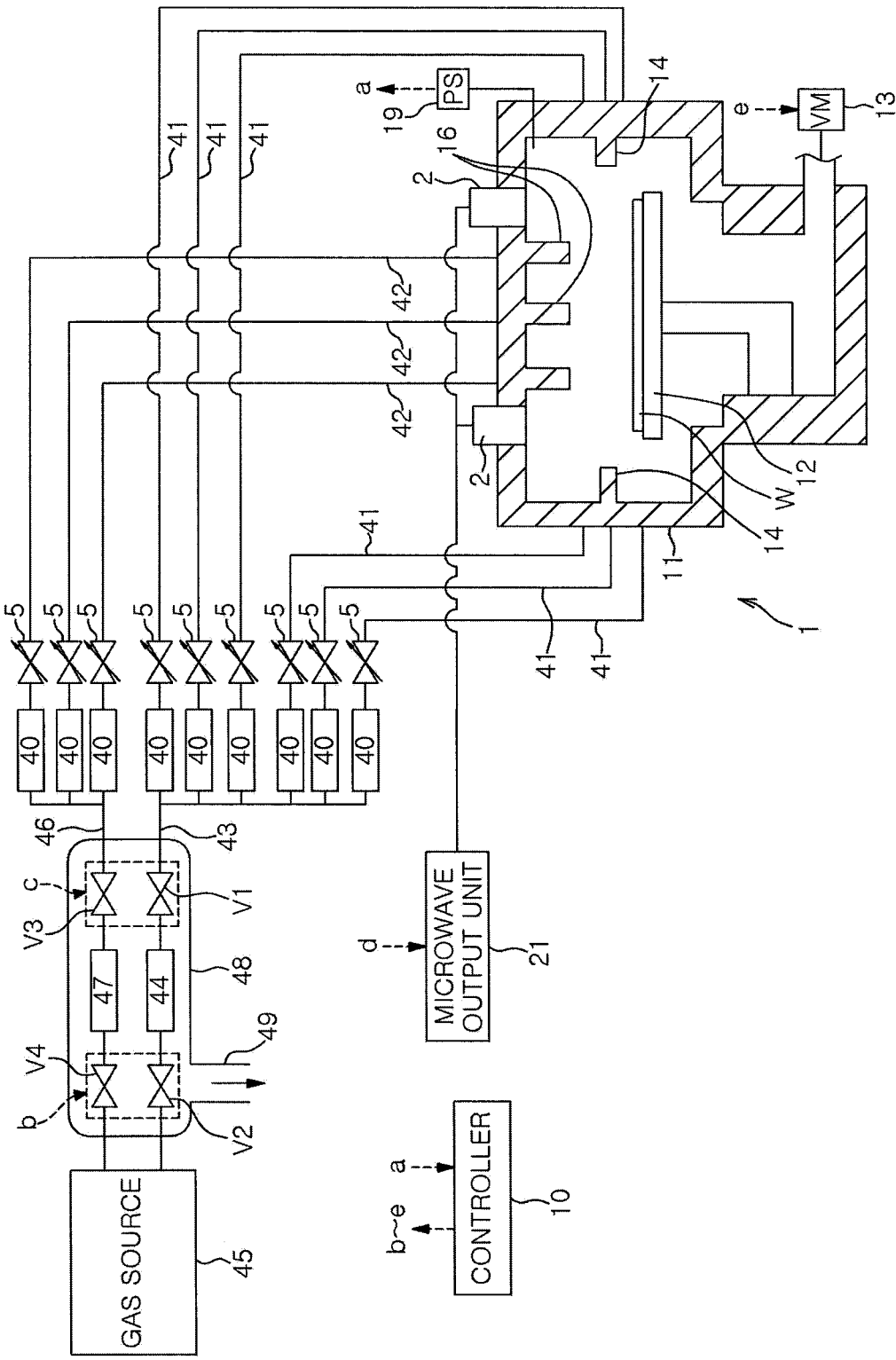
FIG. 1 is a longitudinal side view of a film forming apparatus according to an embodiment of the present disclosure.

As shown in FIG. 1, the film forming apparatus 1 includes the controller 10 serving as an abnormality detector. The controller 10 is a computer and includes a program, a memory, and a central processing unit (CPU). The program has a group of steps for executing a series of operations in the film forming apparatus 1. The controller 10 outputs control signals to individual components of the film forming apparatus 1 and controls the operations of the individual components based on the program. Specifically, the controller 10 controls the opening/closing of the valves V1 to V4, the venting operation of the venting mechanism 13, the supply of microwaves by the microwave output unit 21, and the like. The program is stored in a storage medium such as a compact disk, a hard disk, a DVD, or the like and is installed in the controller 10. Further, the controller includes an alarm output unit for outputting an alarm that notifies the operator of the occurrence of abnormality when the pressure switch 19 is switched ON. The alarm output unit may be, for example, a display or a speaker, and the alarm may be outputted by sound or display.

Hereinafter, a film forming process performed by the film forming apparatus 1 will be described. The wafer W is loaded into the treatment vessel 11 vented to have a predetermined vacuum pressure therein by the venting mechanism 13. Then, the wafer W is placed on the stage 12 by a transfer mechanism (not shown) and heated to a predetermined temperature. Then, the microwaves are supplied from the microwave output unit 21 to the antenna module 2 and radiated into the treatment vessel 11. When the microwaves are radiated, the valves V1 to V4 are opened, and $SiH_4$ gas, $NH_3$ gas, $H_2$ gas containing $B_2H_6$ gas, He gas, and $N_2$ gas are supplied from the sidewall nozzles 14 and the ceiling nozzles 16 into the treatment vessel 11. The gases are activated by action of the microwaves to form plasma. Then, components of plasma of $SiH_4$ gas, $NH_3$ gas, and $B_2H_6$ gas are deposited on the wafer W to form a SiBN film on the wafer W.

Next, the radiation of the microwaves into the treatment vessel 11 is stopped and the supply of $SiH_4$ gas, $NH_3$ gas, $H_2$ gas containing $B_2H_6$ gas, and He gas is stopped. The supply of $N_2$ gas as a purge gas is continued for a predetermined period of time, and, then, the supply of $N_2$ gas is stopped and the wafer W is unloaded from the treatment vessel 11.

During the operation of the film forming apparatus 1, the controller 10 constantly detects whether or not gas leakage is likely to occur. In other words, even during the film formation on the wafer W or in a state where the film forming apparatus is on standby without performing film formation, the controller 10 monitors whether or not a detection signal indicating that a pressure exceeds a threshold is outputted from the pressure switch 19.

Figure 6:
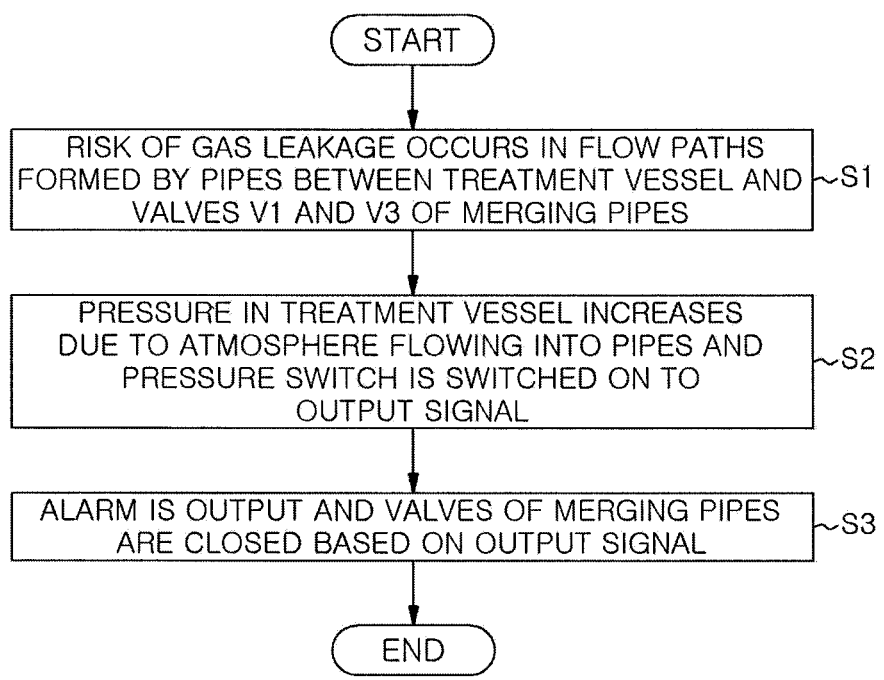
FIG. 6 is a flowchart showing an operation in the film forming apparatus.

Hereinafter, the monitoring and the operation related to the monitoring will be described with reference to the flowchart of FIG. 6. As described above, it is assumed that gas leakage may occur due to a broken sealing between the flow paths formed by the pipes on the downstream side of the valve V1 and on the downstream side of the valve V3 and the outside of the pipes (step S1). In this case, the atmosphere around the pipes flows into the pipes and further into the treatment vessel 11, and the pressure in the treatment vessel 11 increases. When the pressure exceeds the predetermined threshold, the pressure switch 19 is switched ON and the detection signal is outputted to the controller 10 (step S2).

The controller 10 that has received the detection signal outputs an alarm indicating an abnormal state in which gas leakage may occur. When the valves V1 to V4 are opened and the film formation is in progress, a control signal is outputted to close the valves V1 to V4, and the supply of respective gases to the downstream sides of the valves V1 and V3 is stopped to stop the film formation and prevent gas leakage (step S3).

In accordance with the film forming apparatus 1, the valve 5 is disposed in each of the pipes 41 and 42, each of which is branched from the merging pipe 43 or 46 to divert, without being completely closed, a gas to the corresponding pipe 41 or 42, the merging pipes 43 and 46 having the valves V1 and V3 that can be completely closed. The controller 10 monitors the state of the pressure switch 19 that is switched ON and OFF depending on the pressure in the treatment vessel 11. With this configuration, the abnormality in the gas flow paths on the downstream sides of the valves V1 and V3 can be monitored, so that it is possible to prevent the increase in the number of the gas boxes and the number of the pressure switches as described above. In other words, in the film forming apparatus 1, it is possible to prevent, with a simple configuration, gas leakage from the pipe that is extending outside the housing forming the gas box. Further, in the film forming apparatus 1, the valves V1 to V4 are automatically closed when the abnormality is detected, so that the gas leakage can be prevented more reliably.

Further, it is considered that the housing 48 surrounds the valves 5 and the MFMs 40 as well as the valves V1 to V4 and the MFCs 44 and 47. However, as the lengths of the pipes 41 branched from the merging pipe 43 and the pipes branched from the merging pipe 46 increase, the pipe volume increases and the period of time in which the gas reaches the treatment vessel 11 increases. Accordingly, the processing time of the wafer W may be increased. Hence, it is preferable to reduce the lengths of the pipes 41 and 42 and to provide the MFMs 40 and the valves 5 near the treatment vessel 11. However, since the gas box needs to be relatively large in size in order to surround the devices such as the valves and perform a venting operation, it is difficult to provide the gas box near the treatment vessel 11. In other words, in the film forming apparatus 1, the housing 48 is configured to surround only the valves V1 to V4 and the MFCs 44 and 47 without surrounding the valves 5 and the MFMs 40, so that it is possible to provide the valves 5 and the MFMs 40 near the treatment vessel 11 as described above. Accordingly, in the film forming apparatus 1, the processing time of the wafer W can be reduced.

In the above example, the gas supply apparatus is configured as the film forming apparatus 1 for performing CVD. However, the present disclosure is not limited thereto. For example, the gas supply apparatus may be configured as a film forming apparatus for supplying a gas into the treatment vessel 11 to perform atomic layer deposition (ALD). Further, the gas supply apparatus may be configured as an etching apparatus for supplying an etching gas into the treatment vessel 11 to etch the wafer W. Further, the gas supply apparatus may be an apparatus that generates plasma or an apparatus that does not generate plasma during the processing of the wafer W. Further, when the film formation is performed on the wafer W, a film is also formed on the individual components in the treatment vessel 11, so that a cleaning gas is supplied into the treatment vessel 11 to remove the film after the film formation on the wafer W is completed. In the case of supplying the cleaning gas into the treatment vessel 11, the technique of the present disclosure may be applied. Therefore, the technique of the present disclosure is not limited to the case of supplying the processing gas such as a film forming gas or an etching gas for processing the wafer W into the treatment vessel 11.

The opening degree of the valve 5 is not necessarily manually adjusted by the operator. In other words, for the valve 5 that is not completely closed, an opening degree thereof may be changed based on, for example, a control signal from the controller 10. However, the valve 5 described with reference to FIGS. 4 and 5 is preferably used because it has a simple structure and there is no risk that the valve 5 is completely closed by the operator accidentally at the time of adjusting the opening degree. Further, the valve 5 may not be provided with the rotation stopper 65, and the rotation of the handle 64 may be prevented by contacting the handle 64 with the bonnet 52.

The incomplete closing of the valve 5 indicates that the valve 5 is not completely closed at least during the operation of the apparatus. The standby state in which the wafer W waits to be loaded into the treatment vessel 11 and the processing of the wafer W disposed in the treatment vessel 11 are repeated between the power ON state and the power OFF state of the apparatus. It is preferable that the valve 5 is not completely closed during the operation of the apparatus in which the standby state and the processing are repeated. In other words, it is preferable that the valve 5 is not completely closed when it is necessary to detect gas leakage. Therefore, for example, the valve 5 is completely closed during the power OFF state of the apparatus, and a control signal is outputted from the controller 10 when the apparatus is powered on to release the completely closed state of the valve 5, so that the valve 5 is opened at a predetermined opening degree before the first film formation is performed. Then, the valve may be completely closed again when the power is OFF after the final film formation is performed.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

(Evaluation Test)

An evaluation test performed in connection with the film forming apparatus 1 will be described. In this evaluation test, the film forming apparatus 1 is provided with a first pressure gauge for measuring a pressure on the downstream side of the valve V1 of the merging pipe 43 and a second pressure gauge for measuring a pressure on the downstream side of the valve V3 of the merging pipe 46. Then, the treatment vessel 11 was vented by the venting mechanism 13 to form a vacuum atmosphere and $N_2$ gas was supplied to each of the merging pipes 43 and 46. The flow rate of the $N_2$ gas supplied to each of the merging pipes 43 and 46 was gradually increased to a set flow rate for film formation. Then, the pressures measured by the first pressure gauge and the second pressure gauge were monitored at the time of changing the flow rate of the $N_2$ gas. The valves 5 were not completely closed, and the opening degrees thereof were minimized.

Figure 7:
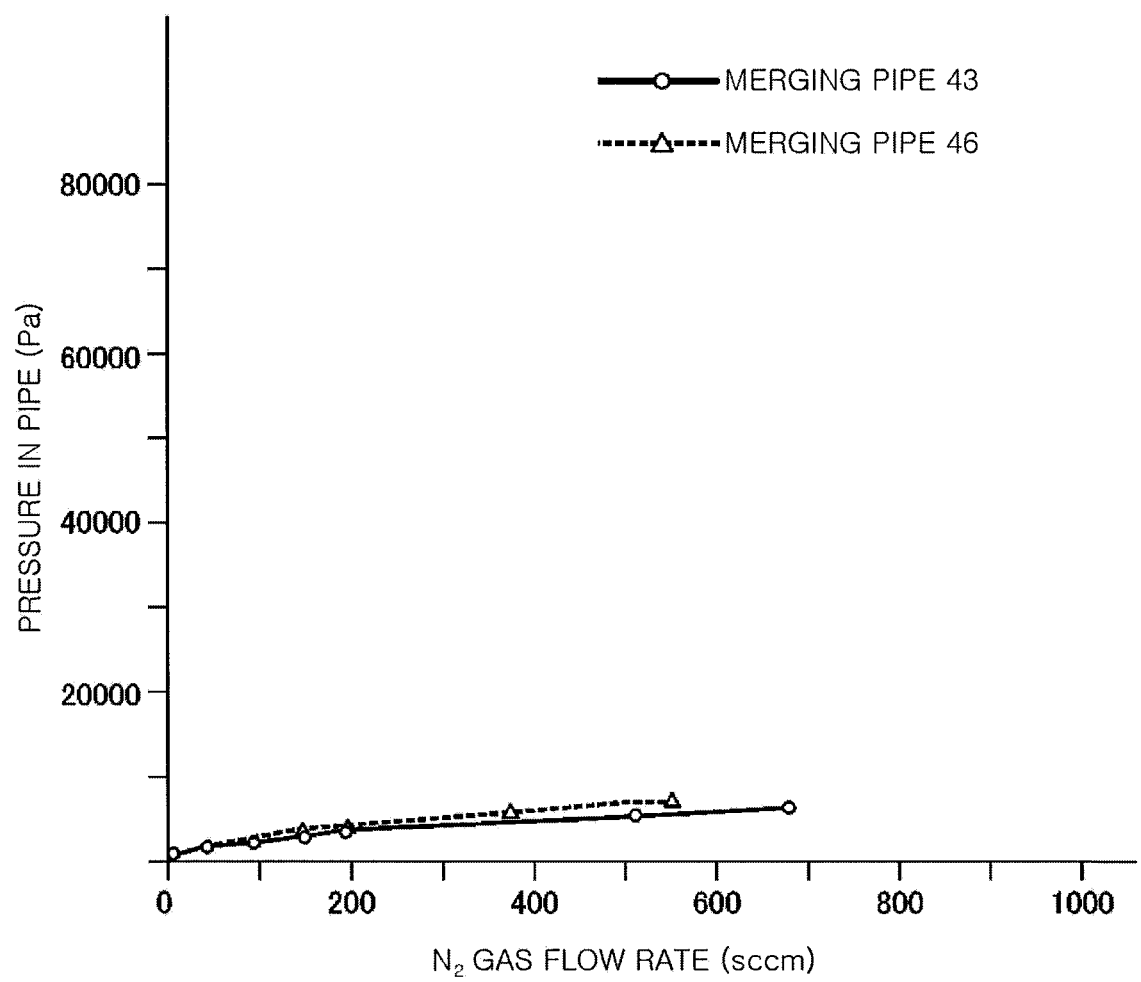
FIG. 7 is a graph showing a result of an evaluation test.

The graph of FIG. 7 shows the result of the evaluation test. A horizontal axis of the graph indicates a supply flow rate of $N_2$ gas (unit: sccm), and a vertical axis of the graph indicates detected pressures in the pipes (unit: Pa). Circular plots show a pressure in the merging pipe 43 and triangular plots show a pressure in the merging pipe 46. As shown in this graph, the pressures in the merging pipes 43 and 46 were increased as the flow rate of the $N_2$ gas was increased. However, even when the flow rate of the $N_2$ gas reached the flow rate for the film formation, the pressures in the merging pipes 43 and 46 were 10 kPa or less, which were maintained at substantially the same level as the pressure in the treatment vessel 11. Therefore, it was confirmed that the pressure switch 19 disposed at the treatment vessel 11 can monitor the pressures in the gas flow paths on the downstream sides of the valves V1 and V3.

DESCRIPTION OF REFERENCE NUMERALS

1: film forming apparatus
10: controller
11: treatment vessel
13: venting mechanism 19: pressure switch
41, 42: pipe
43, 46: merging pipe
45: gas source
V1, V3: valve
5: valve

The invention claimed is:

1. A gas supply apparatus comprising:
a treatment vessel having a substrate therein to perform processing on the substrate;
a venting mechanism configured to vent an inside of the treatment vessel to form a vacuum atmosphere;
a gas supply path including an upstream flow path to which a gas is supplied from a gas source, and a plurality of branch paths formed by branching a downstream side of the upstream flow path into a plurality of paths, each of the branch paths being connected to the treatment vessel;
first valves respectively provided in the branch paths in order to divert the gas supplied to the upstream flow path to the branch paths, each of the first valves having a variable opening degree without being closed completely;
a second valve provided in the upstream flow path to supply the gas or shut off the supply of the gas to a downstream side thereof;
a pressure sensor configured to detect a pressure in the treatment vessel; and
an abnormality detector configured to detect an abnormality in the downstream side of the second valve in the gas supply path based on the detected pressure in the treatment vessel.

2. The gas supply apparatus of claim 1, further comprising:
a housing that surrounds only the second valve between the first valves and the second valve, the housing being configured to vent an inner space thereof.

3. The gas supply apparatus of claim 1, further comprising:
a controller configured to output a control signal to close the second valve when the abnormality is detected by the abnormality detector.

4. The gas supply apparatus of claim 1, further comprising:
a microwave irradiation unit configured to irradiate microwaves to different positions in a circumferential direction in the treatment vessel in plan view and to activate the gas to generate plasma,
wherein downstream ends of the branch paths are connected to different locations in the circumferential direction of the treatment vessel in plan view.

5. The gas supply apparatus of claim 1, wherein each of the first valves includes:
a main body having a flow path of the gas;
a handle that is rotatable with respect to the main body and moves back and forth with respect to the main body depending on a rotation amount;
a valve body portion that is connected to the handle and moves back and forth with respect to the flow path, a width of the flow path being determined by a position of the handle with respect to the main body;
a rotation axis that rotates by the rotation of the handle and connects the handle and the valve body portion; and
a contact member disposed at the rotating axis to restrict the rotation amount of the handle by being in contact with the main body and to prevent the flow path from being completely closed.

6. A gas supply method comprising:
disposing a substrate in a treatment vessel to process the substrate;
venting the treatment vessel using a venting mechanism to form a vacuum atmosphere;
supplying a gas from a gas source to an upstream flow path in a gas supply path including the upstream flow path and a plurality of branch paths formed by branching a downstream side of the upstream flow path into a plurality of paths, each of the branch paths being connected to the treatment vessel and being respectively provided with first valves each having a variable opening degree without being completely closed;
diverting the gas into the branch paths;
supplying the gas or shutting off the supply of the gas to a downstream side thereof using a second valve disposed in the upstream flow path;
detecting a pressure in the treatment vessel using a pressure sensor; and
detecting an abnormality on the downstream side of the second valve in the gas supply path using an abnormality detector based on the detected pressure in the treatment vessel.

* * * * *